US009990954B2

(12) United States Patent
Sekine et al.

(10) Patent No.: US 9,990,954 B2
(45) Date of Patent: Jun. 5, 2018

(54) DISC DEVICE

(71) Applicant: Panasonic Intellectual Property Management Co., Ltd., Osaka (JP)

(72) Inventors: Takeshi Sekine, Kanagawa (JP); Hiroshi Takahashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days. days.

(21) Appl. No.: 15/496,649

(22) Filed: Apr. 25, 2017

(65) Prior Publication Data

US 2017/0229144 A1 Aug. 10, 2017

Related U.S. Application Data

(63) Continuation of application No. PCT/JP2015/005328, filed on Oct. 23, 2015.

(30) Foreign Application Priority Data

Nov. 7, 2014 (JP) ................................. 2014-227400

(51) Int. Cl.
*G11B 17/00* (2006.01)
*G11B 17/22* (2006.01)
(Continued)

(52) U.S. Cl.
CPC ............ *G11B 17/221* (2013.01); *G11B 33/06* (2013.01); *H05K 5/023* (2013.01); *H05K 5/0217* (2013.01); *H05K 5/0221* (2013.01)

(58) Field of Classification Search
CPC .. G11B 17/221; H05K 5/0217; H05K 5/0221; H05K 5/023
See application file for complete search history.

(56) References Cited

U.S. PATENT DOCUMENTS 5,730,031 A 3/1998 Paul et al.
5,918,958 A 7/1999 Paul et al.
(Continued)

FOREIGN PATENT DOCUMENTS

JP 8-104403 A 4/1996
JP 2005-209278 A 8/2005
(Continued)

OTHER PUBLICATIONS

International Search Report for corresponding International Application No. PCT/JP2015/005328 dated Jan. 19, 2016.

*Primary Examiner* — Daniel J Rohrhoff
(74) *Attorney, Agent, or Firm* — Renner Otto Boisselle & Sklar, LLP

(57) ABSTRACT

A disc device of the present disclosure includes a plurality of magazine units aligned in height direction of the disc device. Each of the magazine units includes a plurality of magazine holders each storing at least one magazine, a rail that is slidable in depth direction of the disc device along a side of a housing of the disc device and has higher stiffness than the magazine holders, and a box-shaped handle mounted to a front end of the rail to extend in width direction of the disc device. The plurality of magazine holders is arranged in depth direction of the disc device. The rail holds the plurality of magazine holders at one side of the magazine holder. The handle extends from the front end of the rail toward a free-end side of the magazine holders and includes a recessed engagement portion that admits a finger in depth direction of the disc device and enables the finger to engage when each of the magazine units is pulled out in depth direction of the disc device.

10 Claims, 11 Drawing Sheets

(51) Int. Cl.
*G11B 33/06* (2006.01)
*H05K 5/02* (2006.01)

(56) References Cited

U.S. PATENT DOCUMENTS

| | | | |
|---|---|---|---|
| 2005/0162775 A1* | 7/2005 | Ojima | G11B 15/6835 360/92.1 |
| 2010/0103558 A1* | 4/2010 | Sudou | G11B 15/6835 360/132 |
| 2010/0158575 A1 | 6/2010 | Maeshima et al. | |
| 2010/0172083 A1 | 7/2010 | Randall et al. | |
| 2010/0172087 A1 | 7/2010 | Jeffery et al. | |
| 2012/0127648 A1 | 5/2012 | Randall et al. | |
| 2012/0212909 A1 | 8/2012 | Jeffery et al. | |
| 2013/0263162 A1 | 10/2013 | Yoshida et al. | |
| 2014/0198408 A1* | 7/2014 | Sakuma | G11B 15/6885 360/92.1 |
| 2014/0204522 A1* | 7/2014 | Keffeler | G11B 33/128 361/679.31 |
| 2014/0289750 A1 | 9/2014 | Yoshida et al. | |
| 2015/0074692 A1* | 3/2015 | Yoshida | G11B 23/0323 720/615 |
| 2015/0380043 A1 | 12/2015 | Yoshida et al. | |
| 2017/0055360 A1* | 2/2017 | Della Fiora | H05K 7/1487 |
| 2017/0229144 A1* | 8/2017 | Sekine | G11B 17/221 |

FOREIGN PATENT DOCUMENTS

| | | |
|---|---|---|
| JP | 2010-102804 A | 5/2010 |
| JP | 2010-157310 A | 7/2010 |
| JP | 2010-170101 A | 8/2010 |
| JP | 2012-128901 A | 7/2012 |
| JP | 2013-206498 A | 10/2013 |
| JP | 2013-229087 A | 11/2013 |

\* cited by examiner

FIG. 12
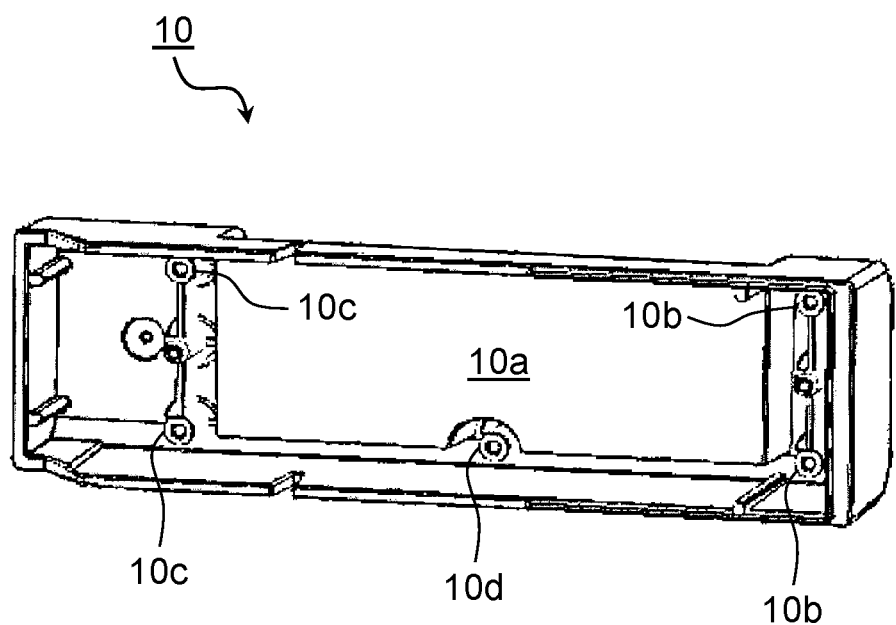
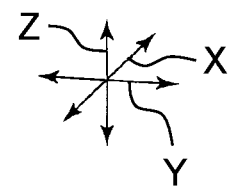

DISC DEVICE

BACKGROUND

1. Technical Field

The present disclosure relates to a disc device configured to supply discs (disc-like information storage media such as CDs and DVDs) to each of a plurality of disc drives.

2. Description of Related Art

A conventionally known disc device of this type is described, for example, in Unexamined Japanese Patent Publication No. 2013-229087.

In the conventional disc device, magazine stockers are provided along guide rails along which a picker is slidably guided. The guide rails are provided to extend in depth direction of the disc device. Each of the magazine stockers has a side provided with a handle on a front side of the device. The magazine stockers can each be moved forward of the device by pulling the handle.

SUMMARY

A disc device according to the present disclosure is configured to supply a plurality of discs to each of a plurality of disc drives. The disc device includes a plurality of magazines each storing the plurality of discs, and a magazine stocker storing the plurality of magazines. The magazine stocker includes a plurality of magazine units aligned in height direction of the disc device. Each of the magazine units includes a plurality of magazine holders each storing at least one of the magazines, a rail that is provided along a side of a housing of the disc device to be slidable in depth direction of the disc device and has higher stiffness than the magazine holders, and a box-shaped handle mounted to a front end of the rail to extend in width direction of the disc device. The plurality of magazine holders is arranged in depth direction of the disc device. The rail holds the plurality of magazine holders at one side of the magazine holder. The handle extends from the front end of the rail toward a free-end side of the magazine holders and includes a recessed engagement portion that admits a finger in depth direction of the disc device and enables the finger to engage when each of the magazine units is pulled out in depth direction of the disc device.

The disc device of the present disclosure facilitates the pullout of the magazine unit, and the magazine unit can store an increased number of magazines.

BRIEF DESCRIPTION OF DRAWINGS

FIG. 12 is a perspective view illustrating a back side of the cover member.

DESCRIPTION OF EMBODIMENT

Figure 1:
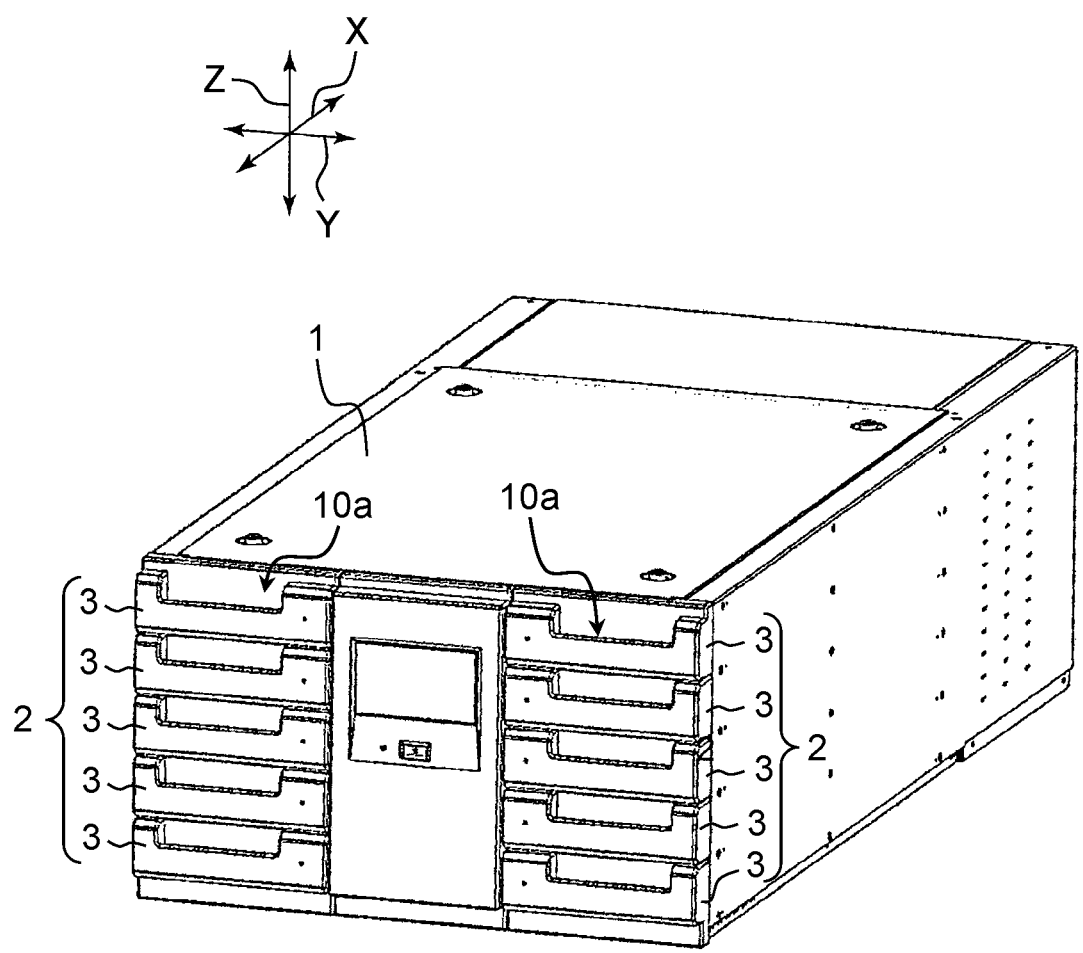
FIG. 1 is an external view in perspective of a disc device according to an exemplary embodiment.

A disc device according to a first aspect of the present disclosure is configured to supply a plurality of discs to each of a plurality of disc drives. The disc device includes a plurality of magazines each storing the plurality of discs, and a magazine stocker storing the plurality of magazines. The magazine stocker includes a plurality of magazine units aligned in height direction of the disc device. Each of the magazine units includes a plurality of magazine holders each storing at least one of the magazines, a rail that is provided along a side of a housing of the disc device to be slidable in depth direction of the disc device and has higher stiffness than the magazine holders, and a box-shaped handle mounted to a front end of the rail to extend in width direction of the disc device. The plurality of magazine holders is arranged in depth direction of the disc device. The rail holds the plurality of magazine holders at one side of the magazine holder. The handle extends from the front end of the rail toward a free-end side of the magazine holders and includes a recessed engagement portion that admits a finger in depth direction of the disc device and enables the finger to engage when each of the magazine units is pulled out in depth direction of the disc device.

According to the first aspect of the present disclosure, the magazine stocker is configured to include the plurality of magazine units aligned in height direction of the disc device. Accordingly, a number of magazines stored in each of the magazine units can be reduced, so that the magazine stocker can be reduced in weight.

Further, according to the first aspect of the present disclosure, the stiffness of the rail is higher than the stiffness of the magazine holders, and the rail holds the plurality of magazine holders in the at one side of the magazine holder. With the higher stiffness of the rail, stiffness can be ensured for the entire magazine unit.

Furthermore, according to the first aspect of the present disclosure, the handle that the finger engages when pulling the magazine unit out of the disc device is box-shaped, thus being highly rigid and lightweight. For this reason, the handle hardly undergoes flexural deformation, so that force with which the handle is pulled is used for slidingly moving the rail out of the disc device substantially without waste. Because of including this handle, the magazine unit is also reduced in weight. Consequently, the pullout of the magazine unit can be carried out easily with small force. Moreover, the need for a mechanism that facilitates the pullout of the magazine unit can thus be eliminated, so that the magazine unit can store an increased number of magazines as compared with a conventional magazine unit.

According to a second aspect of the present disclosure, in the provided disc device of the first aspect, the recessed engagement portion is positioned on a rail side of the handle when viewed in depth direction of the disc device.

According to a third aspect of the present disclosure, in the provided disc device of the first or second aspect, the handle is connected to one of the magazine holders that is in a forward position in the disc device.

According to a fourth aspect of the present disclosure, in the provided disc device of the first, second or third aspect, the handle further includes a box-shaped connecting member mounted to the front end of the rail at one side of the connecting member to extend in width direction of the disc device, and a cover member mounted to the connecting member, the cover member including the recessed engagement portion. The connecting member includes bosses disposed at both sides of the connecting member in width direction of the disc device relative to the recessed engagement portion, with the cover member mounted to the connecting member, the bosses being for mounting to the cover member.

According to a fifth aspect of the present disclosure, in the provided disc device of the fourth aspect, the cover member is formed of resin and is provided with a rib on an inner surface of the recessed engagement portion.

According to a sixth aspect of the present disclosure, in the provided disc device of any one of the first to fifth aspects, the rail is formed of metal.

According to a seventh aspect of the present disclosure, in the provided disc device of any one of the first to sixth aspects, the rail is mounted to respective back faces of the magazine holders, and the magazine holders respectively have, in respective front faces of the magazine holders respectively facing the back faces, openings enabling magazine insertion and magazine removal.

According to an eighth aspect of the present disclosure, in the provided disc device of any one of the first to seventh aspects, the magazine holders adjoin one another by engaging with one another at respective sides.

According to a ninth aspect of the present disclosure, in the provided disc device of any one of the first to eighth aspects, the handle further includes a lock member capable of back-and-forth movement in width direction of the disc device, and when each of the magazine units is stored in the disc device, the lock member can come into contact with a part of the disc device by moving forward for restricting in depth direction magazine-unit movement in the device.

According to a tenth aspect of the present disclosure, in the provided disc device of any one of the first to ninth aspects, a rear end of the rail is provided with a positioning part that comes into contact with a part of the disc device for positioning a rear of each of the magazine units in height direction of the disc device when each of the magazine units is stored in the disc device.

An exemplary embodiment is described hereinafter in detail with reference to the accompanying drawings, as required. It is to be noted that detailed descriptions that are more than necessary may be omitted. For example, there are cases where detailed description of well-known matters and repeated description of substantially the same structure are omitted for the purpose of preventing the following description from needlessly having redundancy, thereby facilitating understanding by those skilled in the art.

It is also to be noted that the accompanying drawings and the following description are provided by the inventors to allow those skilled in the art to sufficiently understand the present disclosure and thus are not intended to limit subject matters described in the claims.

Exemplary Embodiment

FIG. 1 is an external view in perspective of a disc device according to an exemplary embodiment. In the exemplary embodiment, a side of the device in a lower left side of FIG. 1 is referred to as "a front side of the device", while a side of the device in an upper right side of FIG. 1 is referred to as "a rear side of the device".

Disc device 1 of the exemplary embodiment includes two magazine stockers 2. These two magazine stockers 2 are provided to face each other in the device width direction Y. Magazine stockers 2 each include a plurality of magazine units 3 aligned along the device height direction Z that are orthogonal or substantially orthogonal to the device width direction Y.

Figure 2:
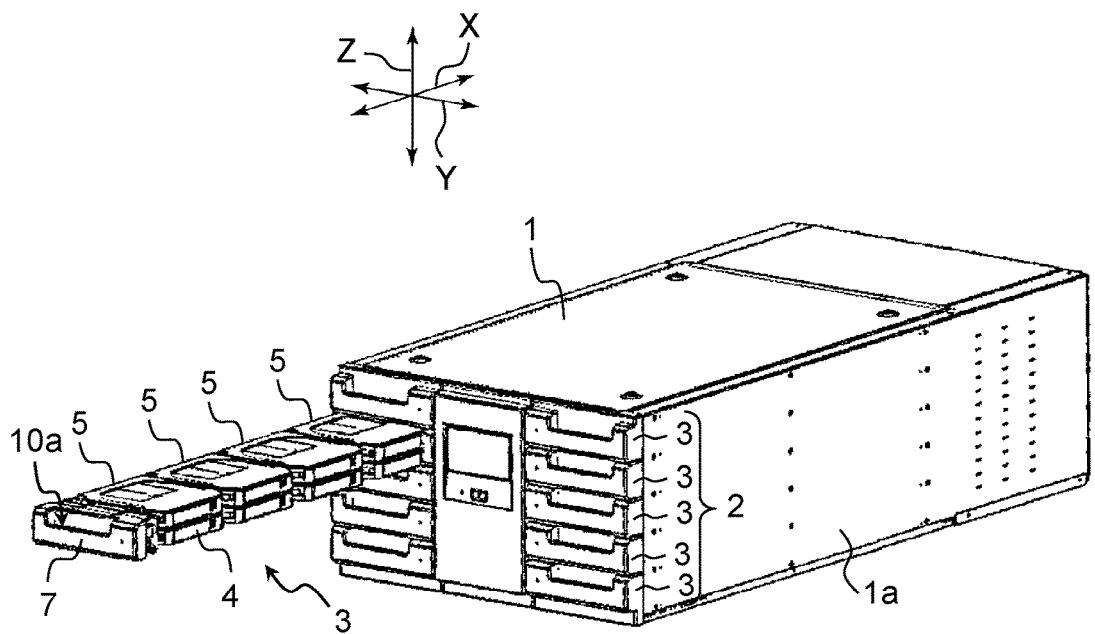
FIG. 2 is a perspective view illustrating one magazine unit pulled out of the disc device of FIG. 1.
Figure 3:
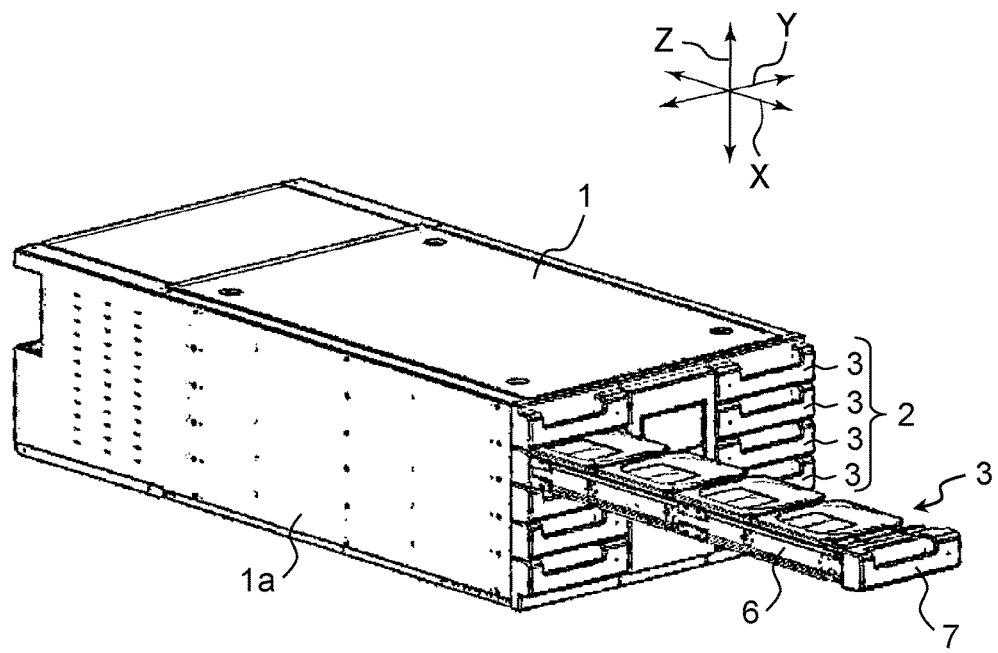
FIG. 3 is a perspective view illustrating the magazine unit pulled out of the disc device of FIG. 1.

FIGS. 2 and 3 are perspective views each illustrating one magazine unit 3 pulled out of disc device 1. Magazine unit 3 includes a plurality of magazine holders 5 each storing magazines 4, and rail 6 provided along side 1a of a housing of disc device 1 to be slidable along the device depth direction X that are orthogonal or substantially orthogonal to the device width direction Y and the device height direction Z. Rail 6 is mounted with, at its front end (its end on the device front side), handle 7 extending along the device width direction Y.

Each of magazines 4 stores a plurality of discs. Disc device 1 is provided with a disc supply mechanism (not illustrated) that supplies the plurality of discs stored by one magazine 4 selected from the plurality of magazines 4 to each of a plurality of disc drives. It is to be noted that any structure other than a structure of magazine stocker 2 is not particularly limited and is thus susceptible of variation. For example, disc device 1 can be structurally similar to a conventional disc device. For this reason, detailed description of any structure other than the structure of magazine stocker 2 is omitted here.

Figure 4:
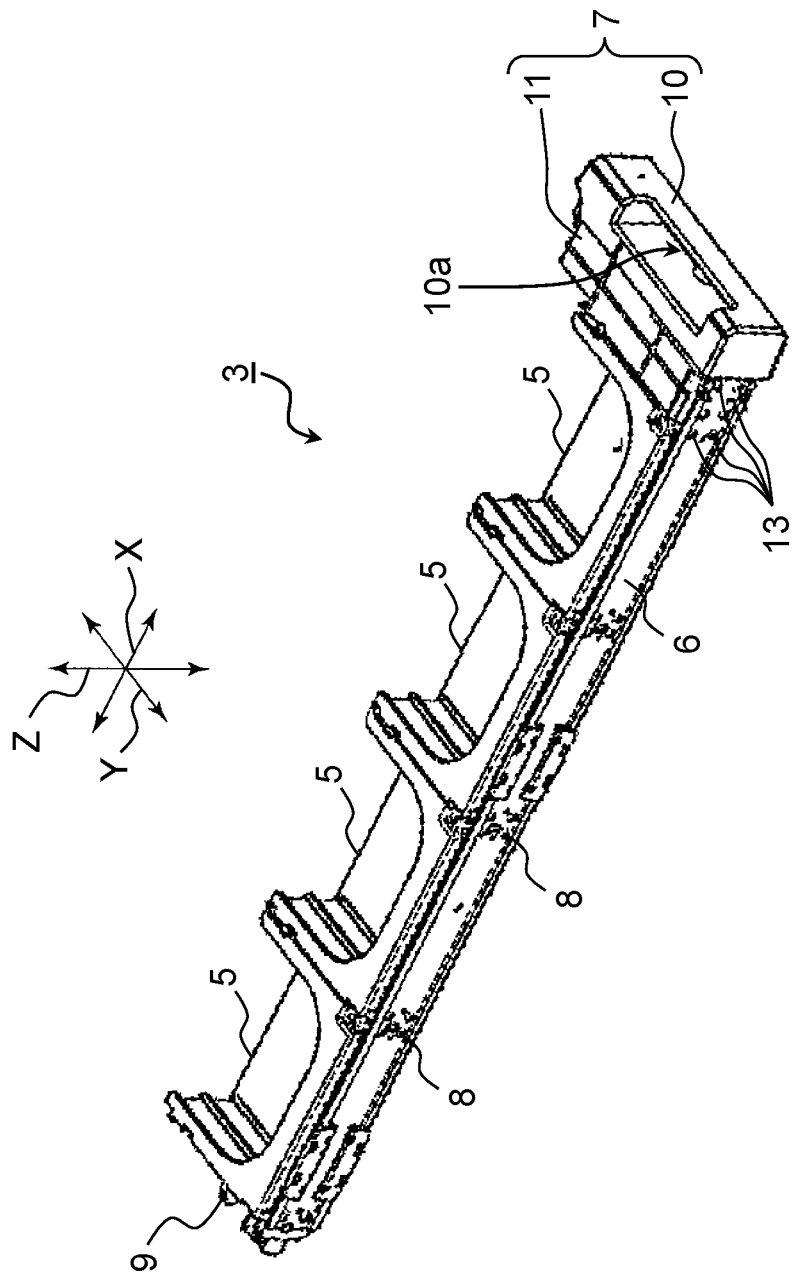
FIG. 4 is a perspective view of the magazine unit.
Figure 5:
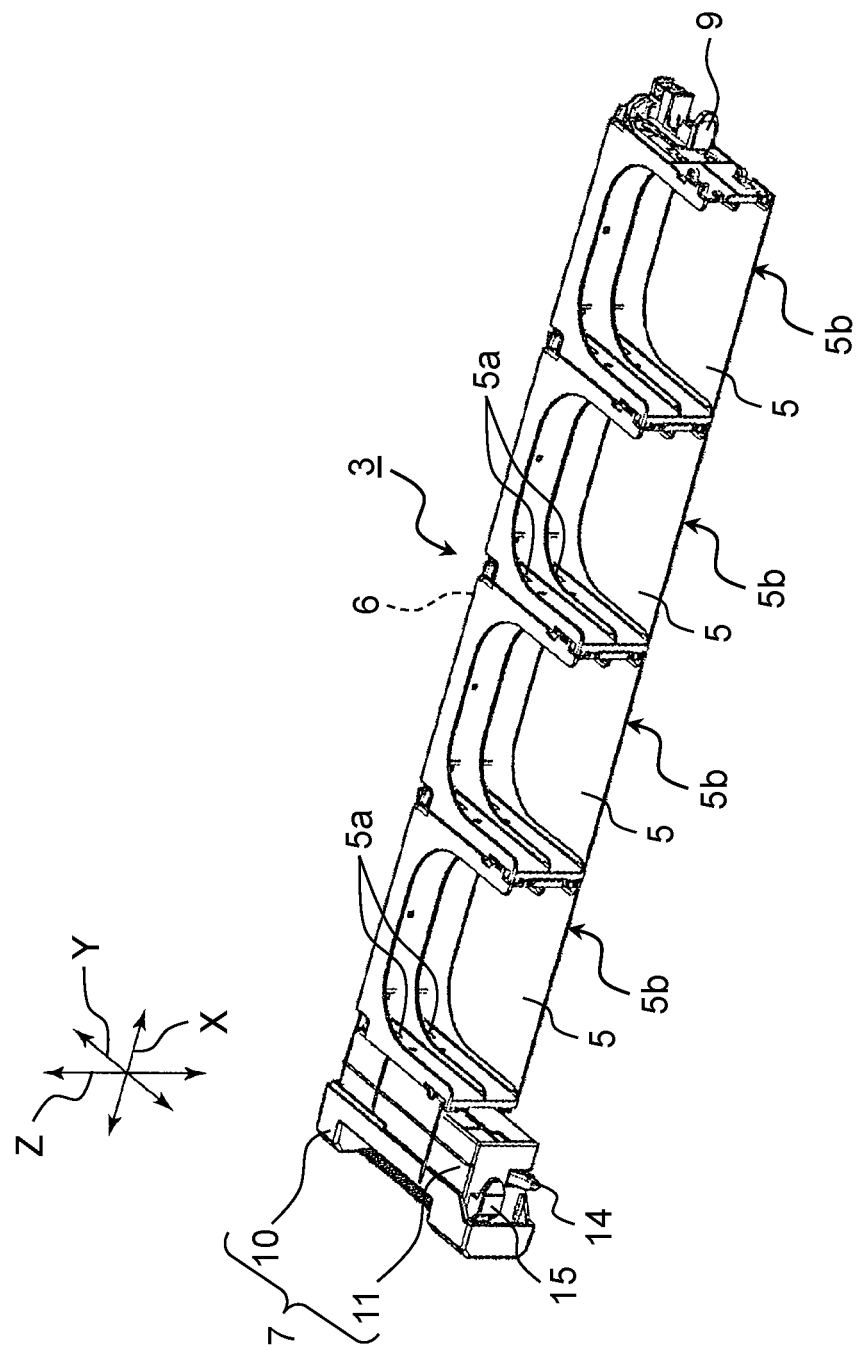
FIG. 5 is a perspective view of the magazine unit.
Figure 6:
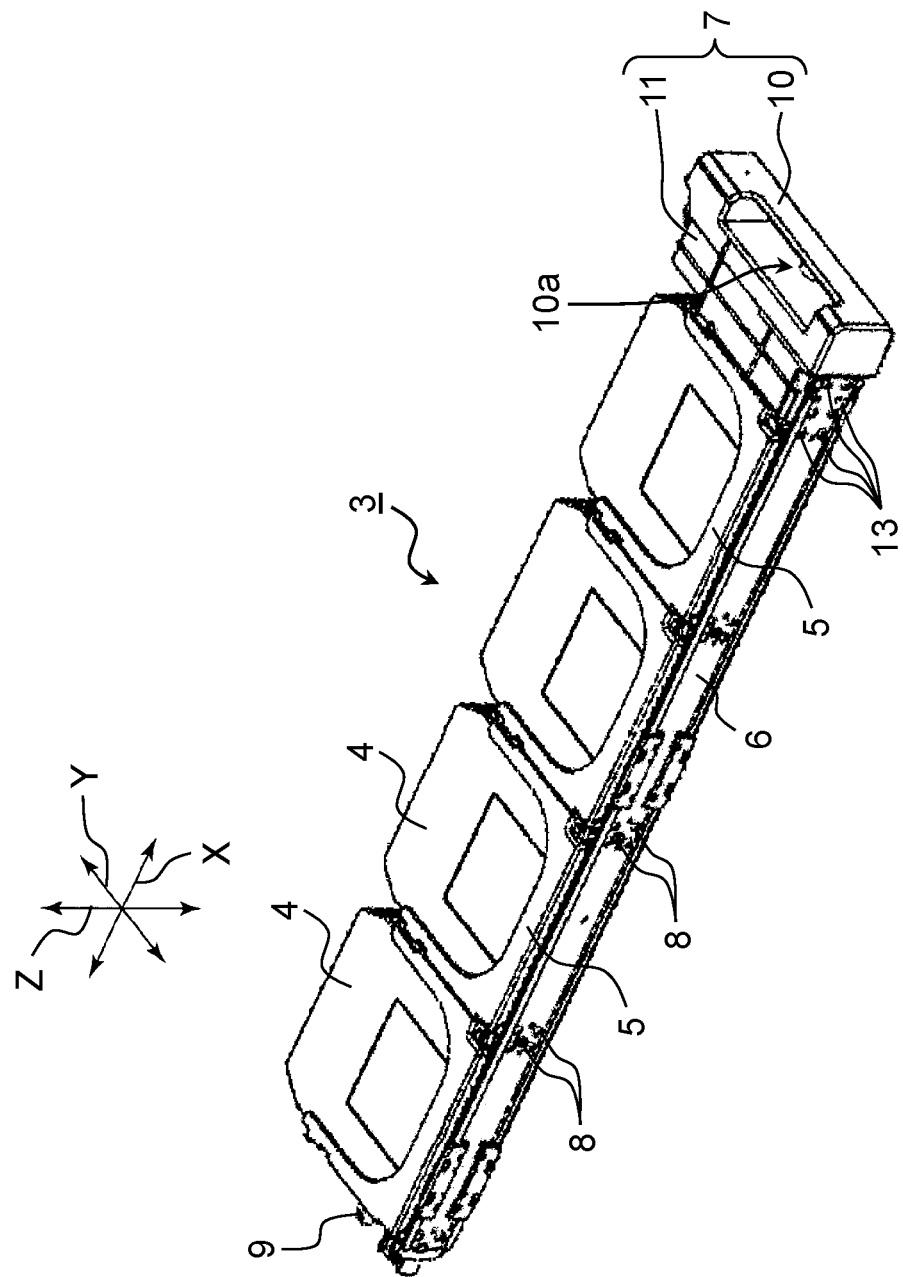
FIG. 6 is a perspective view illustrating the magazine unit storing magazines.
Figure 7:
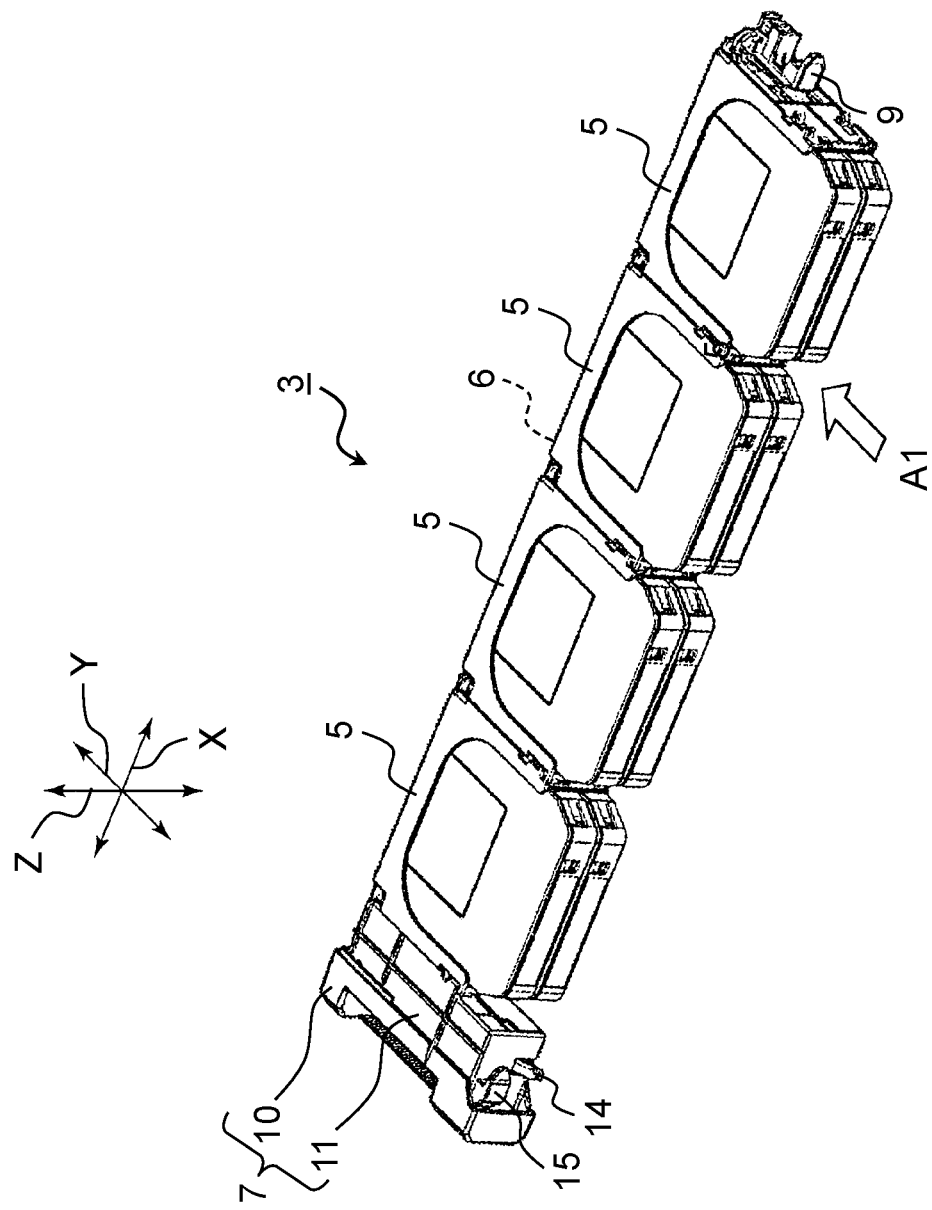
FIG. 7 is a perspective view illustrating the magazine unit storing the magazines.
Figure 8:
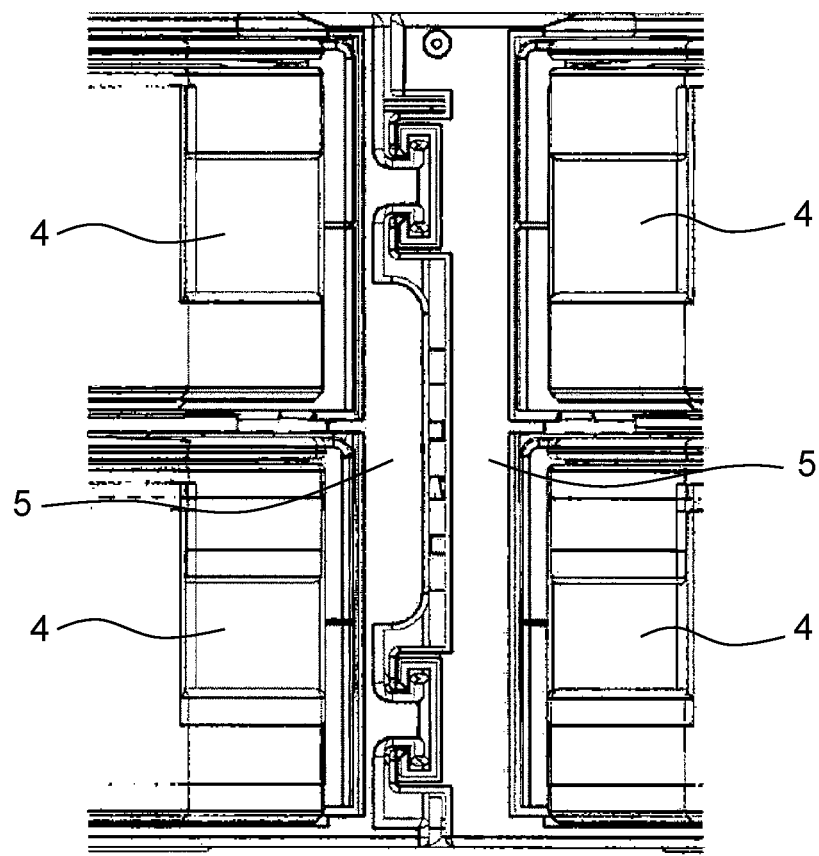
FIG. 8 is an enlarged front view of a portion of the magazine unit as seen in a direction of arrow A1 in FIG. 7.

With reference to FIGS. 4 to 8, a detailed description will be given next of a structure of magazine unit 3. FIGS. 4 and 5 are perspective views of magazine unit 3. FIGS. 6 and 7 are perspective views each illustrating magazine unit 3 storing magazines 4. FIG. 8 is an enlarged front view of a portion of magazine unit 3 as seen in a direction of arrow A1 in FIG. 7.

Each of magazine holders 5 is formed of, for example, resin to store at least one magazine 4. In the exemplary embodiment, magazine holder 5 is formed to store two magazines 4 so that these two magazines 4 align along the device height direction Z. As shown in FIG. 5, magazine holder 5 is provided with, on its inner side, retaining springs 5a capable of retaining respective magazines 4 inserted in magazine holder 5. Magazine 4 is partly urged by retaining spring 5a, thereby being retained inside magazine holder 5.

The plurality of magazine holders 5 is arranged along the device depth direction X. As shown in FIG. 8, magazine holders 5 adjoin one another by engaging with one another at respective sides. In this way, the plurality of magazine holders 5 is integrated in series. As shown in FIG. 5, each of magazine holders 5 is provided with, in its front face, opening 5b enabling insertion and removal of magazines 4.

Rail 6 is mounted to respective back faces of magazine holders 5. As shown in FIGS. 4 and 6, rail 6 is mounted to each of magazine holders 5 by, for example, engagement of a plurality of screws 8 respectively passing through a plurality of through holes in rail 6 in a respective plurality of screw holes in the back face of magazine holder 5. In this way, rail 6 holds the plurality of magazine holders 5 at one side of magazine holders 5.

Rail 6 is formed of material that has higher stiffness than material used for magazine holders 5, and such material for rail 6 is, for example, metal. With the higher stiffness of rail 6, stiffness can be ensured for entire magazine unit 3. This means that with the higher stiffness of rail 6, deformation such as flexure is suppressed for magazine unit 3. It is to be noted that rail 6 measures, for example, 700 mm along the device depth direction X.

As shown in FIGS. 5 and 7, a rear end (an end on the device rear side) of rail 6 is provided with positioning part 9 that comes into contact with a part of disc device 1 for positioning a rear of magazine unit 3 in the device height direction Z when magazine unit 3 is stored in disc device 1. In the exemplary embodiment, positioning part 9 is formed of a projection provided to project rearward of the device from the rear end of rail 6 that is bent along a side of magazine holder 5 positioned in a rearmost position in the device to form an L shape. In this case, the part of disc device 1 is, for example, recessed, and the rear of magazine unit 3 is positioned in the device height direction Z as a result of insertion of the projection in the recessed part.

As shown in FIGS. 4 and 5, handle 7 has a box shape extending along the device width direction Y and is mounted to extend from the front end of rail 6 toward a free-end side of magazine holders 5. Specifically, handle 7 includes cover member 10 extending along the device width direction Y positioned on the front side of disc device 1, and box-shaped connecting member 11 mounted to the front end of rail 6 to extend along the device width direction Y.

Cover member 10 is formed of, for example, resin. Moreover, cover member 10 includes, as shown in FIGS. 4 and 6, recessed engagement portion 10a that enables a finger to engage when magazine unit 3 is pulled out of disc device 1.

Recessed engagement portion 10a has the shape of a recess formed in an outer surface of cover member 10 and enables the finger to engage when magazine unit 3 is pulled out in the device depth direction X. Recessed engagement portion 10a also enables the finger to enter from the front side of disc device 1 in the device counter depth direction X.

In the case of the present exemplary embodiment, recessed engagement portion 10a is, for example, of substantially "L-shaped" section when viewed in the device width direction Y. Moreover, recessed engagement portion 10a has such a size as to admit four fingers.

Recessed engagement portion 10a such as above admits the finger in the device counter depth direction X to enable the pullout of magazine unit 3 with the plurality of magazine units 3 closely aligned along the device height direction Z as shown in FIG. 1.

In the case of the present exemplary embodiment, recessed engagement portion 10a is configured to also admit the finger in the device height direction Z with magazine unit 3 pulled out of disc device 1.

Moreover, when viewed in the device counter depth direction X in FIGS. 4 and 6, recessed engagement portion 10a is positioned on a rail side of handle 7, that is to say, on a rail side of cover member 10 in the case of the present exemplary embodiment. Thus, force with which the finger pulls magazine unit 3 out of disc device 1 by engaging against recessed engagement portion 10a is easily transmitted to rail 6. Consequently, the pullout of magazine unit 3 can be carried out easily with the small force.

A description will be given next of connecting member 11 of handle 7 with reference to FIGS. 9 to 12.

Figure 9:
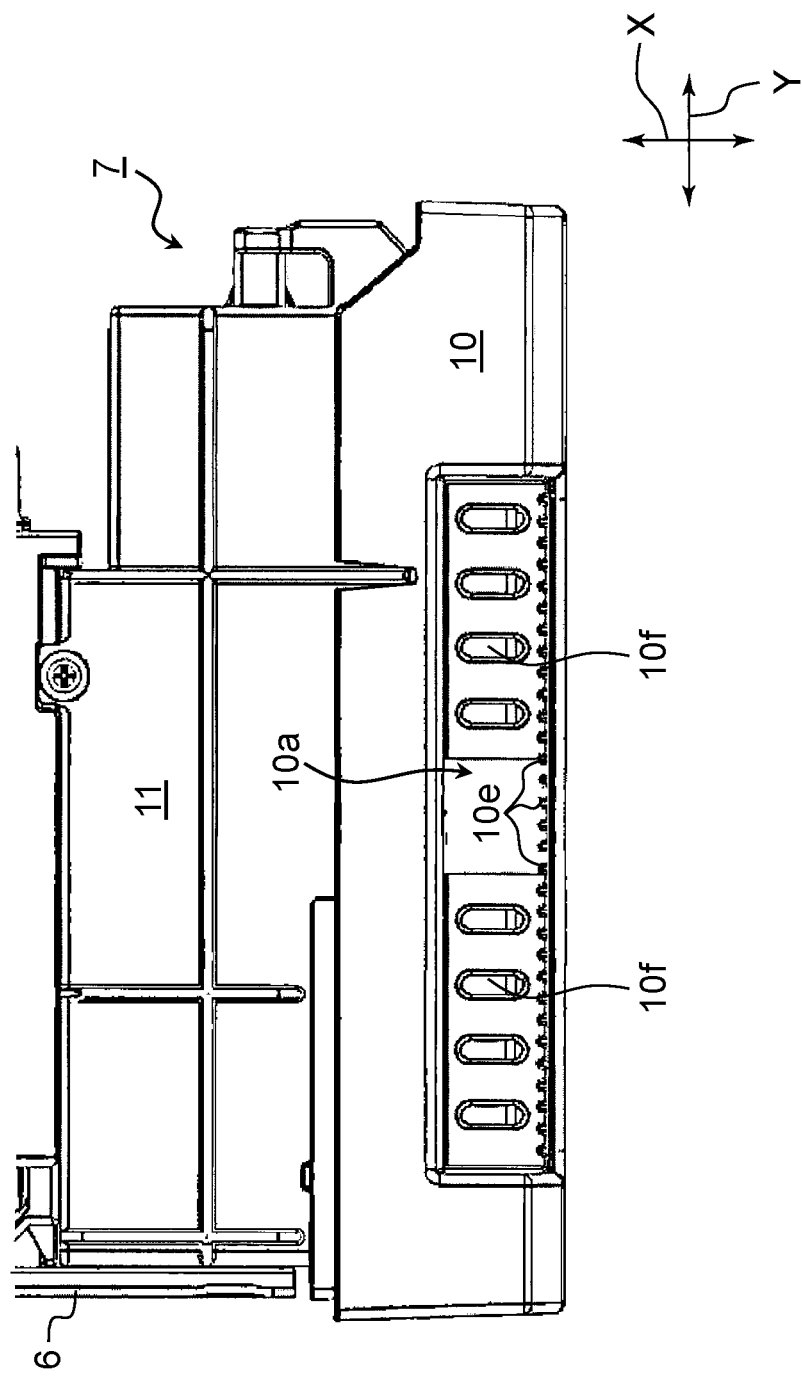
FIG. 9 illustrates a handle seen in height direction from above the disc device.
Figure 10:
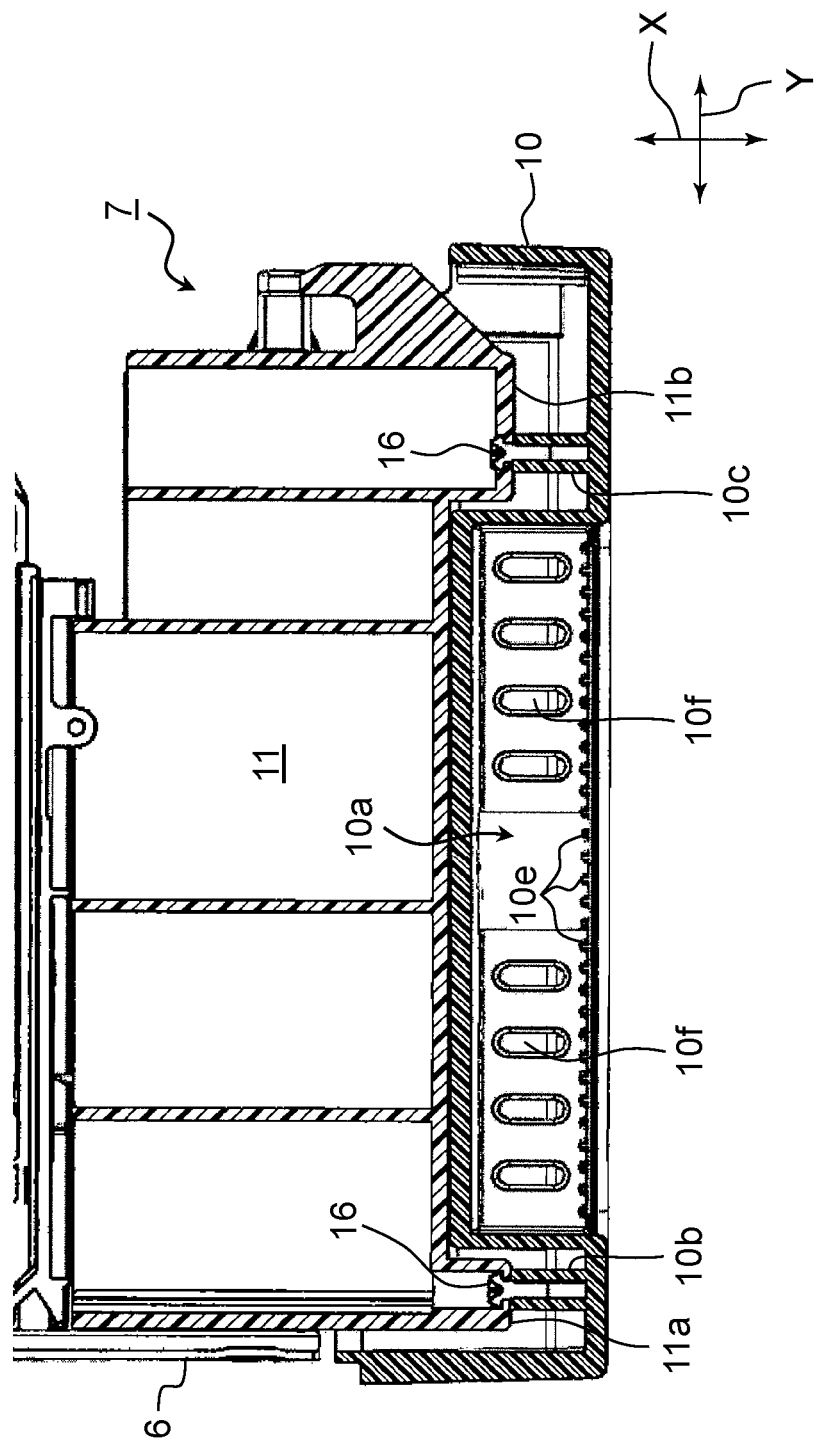
FIG. 10 is a sectional view of the handle, the section being taken orthogonally to height direction of the disc device.
Figure 11:
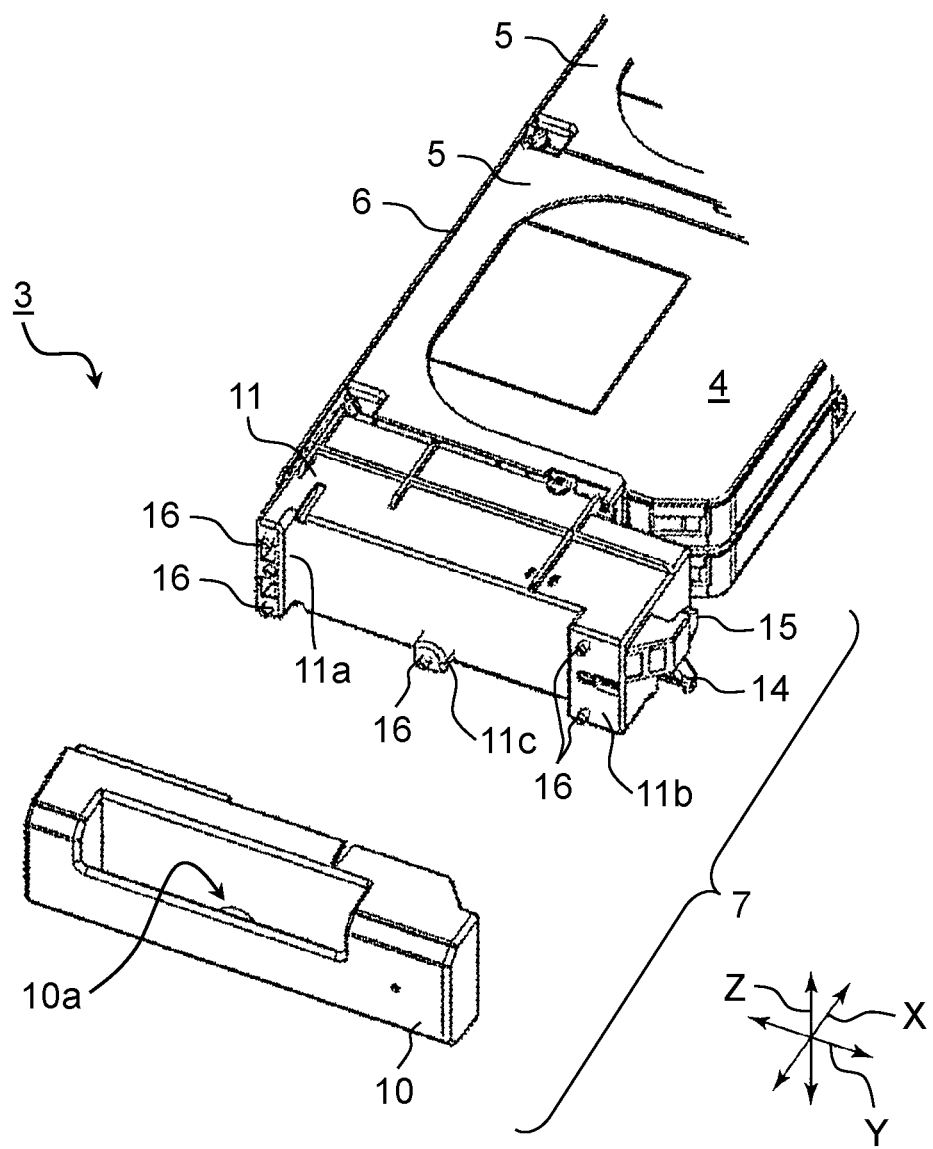
FIG. 11 is a perspective view illustrating a cover member of the handle removed from the magazine unit.

FIG. 9 illustrates handle 7 seen from above in the device height direction Z. FIG. 10 is a sectional view of handle 7, the section being taken orthogonally to the device height direction Z. FIG. 11 illustrates cover member 10 of handle 7 removed from magazine unit 3, and FIG. 12 illustrates a back side of cover member 10.

Connecting member 11 of handle 7 has the shape of a hollow box as shown in FIG. 10 and is formed of resin. This connecting member 11 is mounted at its back face (its end face positioned in one of the device width direction Y) to the front end of rail 6.

Connecting member 11 and rail 6 are mounted to each other by, for example, engaging a plurality of screws 13 respectively passing through through holes in rail 6 in respective screw holes in the back face of connecting member 11 as shown in FIGS. 4 and 6. In this way, rail 6 holds connecting member 11 at one side of connecting member 11.

Connecting member 11 is connected not only to rail 6 but also to magazine holder 5 in a forward (forwardmost) position in disc device 1 in the device depth direction X by means of, for example, a screw. Because of being mounted to rail 6 in the manner described earlier, this magazine holder 5 functions as a brace to enhance stiffness of a structure formed of connecting member 11 and rail 6. Consequently, the stiffness of entire magazine unit 3 also improves.

As shown in FIGS. 5 and 7, connecting member 11 is internally provided with lock member 14 capable of back-and-forth movement along the device width direction Y. When magazine unit 3 is stored in disc device 1, lock member 14 can come into contact with a part of disc device 1 by moving outward of connecting member 11, thereby restricting movement of magazine unit 3 in the device depth direction X. It is to be noted that lock member 14 moves back into connecting member 11 by being, for example, contacted and pressed by a part of a picker that moves up and down in disc device 1, thereby releasing its restriction on the movement of magazine unit 3 in the device depth direction X.

As shown in FIGS. 5 and 7, provided near lock member 14 of connecting member 11 is positioning part 15 that comes into contact with a part of disc device 1 for positioning a front of magazine unit 3 in the device height direction Z when magazine unit 3 is stored in disc device 1. In the exemplary embodiment, positioning part 15 is formed of a projection provided to project toward the device rear side on a side of connecting member 11 where lock member 14 moves back and forth. In this case, the part of disc device 1 is, for example, recessed, and the front of magazine unit 3 is positioned in the device height direction Z as a result of insertion of the projection in the recessed part.

Positioning of magazine unit 3 in the device width direction Y is effected by slidably mounting rail 6 in the device counter depth direction X along the side 1a of the housing of disc device 1.

In the case of the present exemplary embodiment, cover member 10 is mounted to a front side of connecting member 11 by means of, for example, a plurality of screws 16 as shown in FIGS. 9 to 11. Specifically, connecting member 11 includes a plurality of bosses 11a, 11b, 11c projecting toward the front side of disc device 1 as shown in FIG. 11, and these bosses 11a, 11b, 11c abut on the back side of cover member 10. Bosses 11a, 11b are provided at both sides of connecting member 11 in the device width direction Y. Boss 11c is provided in a substantially middle position of connecting member 11 along the device width direction Y on a lower end of connecting member 11 in the device height direction Z. These bosses 11a, 11b, 11c have through holes formed in their tops for passage of respective screws 16.

On the other hand, as shown in FIGS. 10 and 12, the back side of cover member 10 is formed with a plurality of bosses 10b, 10c, 10d in respective positions where the plurality of bosses 11a, 11b, 11c of connecting member 11 can be brought into abutment. The plurality of bosses 10b, 10c, 10d of cover member 10 have, in its respective tops, female screw holes in which respective screws 16 engage. Cover member 10 is mounted to connecting member 11 by engaging screws 16 respectively passing through the through holes in bosses 11a, 11b, 11c of connecting member 11 in the respective female screw holes in respective bosses 10b, 10c, 10d of cover member 10.

In the case of the present exemplary embodiment, bosses 10b, 10c, 10d of cover member 10 that are used for mounting to connecting member 11 are provided to surround recessed engagement portion 10a as shown in FIG. 12. It is to be noted that recessed engagement portion 10a formed in the outer surface of cover member 10 bulges out on the back side of cover member 10.

Specifically, bosses 11a, 11b of connecting member 11 are positioned, as shown in FIG. 10, at the both sides of connecting member 11 in the device width direction Y relative to recessed engagement portion 10a with cover member 10 mounted to connecting member 11. Boss 11c of connecting member 11 is positioned below recessed engagement portion 10a of cover member 10 in the device height direction Z. Deformation of cover member 10 can thus be suppressed when the finger engages against recessed engagement portion 10a to pull out magazine unit 3. Moreover, handle 7 having cover member 10 and connecting member 11 can have high stiffness.

For the purpose of improving stiffness of cover member 10, as shown in FIGS. 9 and 10, recessed engagement portion 10a is provided with ribs 10e on its inner surface. In the case of the present exemplary embodiment, the plurality of ribs 10e extending along the device height direction Z is provided in a position of the inner surface of recessed engagement portion 10a on the front side of disc device 1 where the finger engages when pulling out magazine unit 3. With the plurality of ribs 10e provided, recessed engagement portion 10a can have improved stiffness. These ribs 10e also function as slip stoppers when the finger engages against recessed engagement portion 10a to pull out magazine unit 3.

In the case of the present exemplary embodiment, recessed engagement portion 10a of cover member 10 is formed with a plurality of through holes 10f in its bottom as shown in FIGS. 9 and 10. Accordingly, cover member 10 can be reduced in weight. This means that magazine unit 3 can be reduced in weight correspondingly. In cases where cover member 10 undergoes spray coating, air within recessed engagement portion 10a escapes from the through holes 10f, so that paint can reach inside recessed engagement portion 10a. Thus, cover member 10 coated with the paint externally as well as internally of recessed engagement portion 10a can be made.

According to disc device 1 of the present exemplary embodiment, magazine stocker 2 is configured to include the plurality of magazine units 3 aligned along the device height direction Z. Accordingly, a number of magazines stored in one magazine unit 3 can be reduced, so that magazine stocker 2 can be reduced in weight (to be not more than 3 kg, for example).

According to disc device 1 of the present exemplary embodiment, the stiffness of rail 6 is higher than the stiffness of magazine holders 5, and rail 6 holds the plurality of magazine holders 5 at one side of the magazine holder. With rail 6 having the higher stiffness, entire magazine unit 3 can have the increased stiffness.

According to disc device 1 of the present exemplary embodiment, handle 7 that the finger engages when pulling magazine unit 3 out of disc device 1 is box-shaped, thus being highly rigid and lightweight. For this reason, handle 7 hardly undergoes flexural deformation, so that the force with which handle 7 is pulled is used for slidingly moving rail 6 out of disc device 1 substantially without waste. Because of including handle 7, magazine unit 3 is reduced in weight correspondingly. Consequently, the pullout of magazine unit 3 can be carried out easily with the small force. Moreover, the need for a mechanism that facilitates the pullout of magazine unit 3 can thus be eliminated, so that magazine unit 3 can store an increased number of magazines 4 as compared with a conventional magazine unit.

It is to be noted that the present disclosure is not limited to the above exemplary embodiment.

According to disc device 1 of the above exemplary embodiment, magazine holders 5 adjoin one another by engaging with one another. In this way, adjoining magazine holders 5 mutually increase their stiffness, and thus deformation of magazine holders 5 can be suppressed.

Alternatively, the plurality of magazine holders 5 may be, for example, formed integrally of resin. In other words, magazine holders 5 may be formed in the form of one continuous component. In this case, however, the continuous component defining magazine holders 5 becomes considerably longer (for example, not less than 500 mm). Accordingly, a mold of larger size is required, thus causing increase in manufacturing cost. On the other hand, the structure of the present exemplary embodiment only requires a mold of smaller size with which one magazine holder 5 can be molded, so that manufacturing cost can be suppressed.

In the case of the above exemplary embodiment, rail 6 is formed of the metal; however, the present disclosure is not limited to this. Rail 6 may be formed of any material that can ensure stiffness of entire magazine unit 3, that is to say, any material that can suppress the deformation of magazine unit 3.

In the case of the above exemplary embodiment, recessed engagement portion 10a of cover member 10 of handle 7 is, as shown in FIGS. 4 and 6, such a recess as to enable the finger to enter in the device counter depth direction X as well as in the device height direction Z; however, the present disclosure is not limited to this. In other words, recessed engagement portion 10a may be such a recess as to admit the finger with the entry of the finger not being obstructed by cover member 10 of another magazine unit 3 when magazine units 3 are aligned along the device height direction Z as shown in FIG. 1. Thus, recessed engagement portion 10a may be such a recess as to admit the finger at least in the device counter depth direction X.

The exemplary embodiment has been described above as being illustrative of the technique of the present disclosure, and the appended drawings and the detailed description have been provided for this purpose. For illustration of the technique, the components that are shown in the appended drawings and described in the detailed description can include not only components essential for solving the problems but also components not essential for solving the problems. For this reason, those nonessential components that are shown in the appended drawings and described in the detailed description should not immediately be acknowledged as essential.

In addition, because the above exemplary embodiment is intended to be illustrative of the technique of the present disclosure, various modifications, substitutions, additions, omissions, and the like can be made within the scope of the claims or equivalents of the claims.

A disc device according to the present disclosure facilitates pullouts with respect to a magazine stocker and enables the magazine stocker to store an increased number of magazines and is thus useful for including particularly a large number of magazines.

What is claimed is:

1. A disc device configured to supply a plurality of discs to each of a plurality of disc drives, the disc device comprising:
   a plurality of magazines each storing the plurality of discs; and
   a magazine stocker storing the plurality of magazines,
   wherein the magazine stocker includes a plurality of magazine units aligned in height direction of the disc device,
   wherein each of the magazine units includes:
   a plurality of magazine holders each storing at least one of the magazines;
   a rail provided along a side of a housing of the disc device, where the rail is slidable in depth direction of the disc device, the rail having higher stiffness than the magazine holders; and
   a handle mounted to a front end of the rail, the handle which is box-shaped and extends in width direction of the disc device,
   wherein the plurality of magazine holders is arranged in depth direction of the disc device,
   the rail holds the plurality of magazine holders at one side of the magazine holder in width direction of the disc device,
   a recessed engagement portion is provided on the handle in a direction from a rail side of the magazine holder toward a free-end side of the magazine holder, and
   the recessed engaged portion allows a finger to pull the magazine units in depth direction of the disc device.

2. The disc device according to claim 1, wherein the recessed engagement portion is provided on a rail side of the handle in width direction of the disc device.

3. The disc device according to claim 1, wherein the handle is connected to one of the magazine holders that is in a forward position in the disc device.

4. The disc device according to claim 1, wherein
   the handle further includes a box-shaped connecting member and a cover member,
   the connecting member is mounted to the front end of the rail,
   the rail holds the connecting member at one side of the connecting member in width direction of the disc device,
   the cover member is mounted to the connecting member, the cover member including the recessed engagement portion,
   the connecting member includes bosses disposed at both sides of the connecting member in width direction of the disc device relative to the recessed engagement portion, and
   the bosses are engaged with the cover member when the cover member is mounted to the connecting member.

5. The disc device according to claim 4, wherein
   the cover member is formed of resin, and
   a rib is provided on an inner surface of the recessed engagement portion.

6. The disc device according to claim 1, wherein the rail is formed of metal.

7. The disc device according to claim 1, wherein
   each of the magazine holders is mounted to the rail at the back surface of the respective magazine holder,
   each of the magazine holders has an opening on a front surface, which is opposite to the back surface, of the magazine holder, and
   the magazine can be inserted into and removed out of the magazine holder through the opening.

8. The disc device according to claim 1, wherein
   the magazine holders include a first magazine holder and a second magazine holder,
   the second magazine holder is adjacent to the first magazine holder, and
   the first magazine holder and the second magazine holder are engageable with each other at a side surface of the first magazine holder and a side surface of the second magazine holder.

9. The disc device according to claim 1, wherein
   the handle further includes a lock member which is movable in width direction of the disc device,
   the lock member can contact with the disc device, when the magazine unit is pulled from stored position where the magazine unit is inside the disc device, and
   the lock member restricts movement of the magazine unit in depth direction of the disc device when the lock member contacts with the disc device.

10. The disc device according to claim 1, wherein
    a positioning portion is provided on a rear end of the rail, and
    the positioning portion comes into contact with the disc device and restricts the height direction position of the magazine unit at a rear end when the magazine units are stored in the disc device.

* * * * *